US008553463B1

(12) United States Patent  
Pollachek et al.

(10) Patent No.: US 8,553,463 B1
(45) Date of Patent: Oct. 8, 2013

(54) VOLTAGE DISCHARGE CIRCUIT HAVING DIVIDED DISCHARGE CURRENT

(75) Inventors: Robert Gary Pollachek, Vancouver, WA (US); Loren Mclaury, Hillsboro, OR (US); Fabiano Fontana, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 339 days.

(21) Appl. No.: 13/052,142

(22) Filed: Mar. 21, 2011

(51) Int. Cl.
*G11C 16/06* (2006.01)

(52) U.S. Cl.
USPC ............. 365/185.25; 365/185.21; 365/189.09

(58) Field of Classification Search
USPC ............. 365/185.25, 185.21, 185.29, 189.09, 365/189.11, 203, 205
See application file for complete search history.

(56) References Cited

U.S. PATENT DOCUMENTS

| 4,038,567 | A | * | 7/1977 | Lewis et al. ..................... 326/86 |
| 5,719,807 | A | * | 2/1998 | Sali et al. ................. 365/185.25 |
| 6,373,749 | B1 | * | 4/2002 | Atsumi et al. ........... 365/185.29 |
| 7,200,047 | B2 |  | 4/2007 | Gualandri et al. |
| 7,203,098 | B2 |  | 4/2007 | Mihnea et al. |
| 7,272,053 | B2 |  | 9/2007 | Choy |
| 7,372,739 | B2 |  | 5/2008 | Macerola |
| 7,397,699 | B2 |  | 7/2008 | Trinh |
| 7,738,299 | B2 |  | 6/2010 | Kuriyama et al. |
| 7,817,474 | B2 |  | 10/2010 | Shields et al. |
| 7,876,079 | B2 | * | 1/2011 | Nirschl ......................... 323/283 |
| 7,881,122 | B2 | * | 2/2011 | Ariki ........................ 365/185.25 |

* cited by examiner

*Primary Examiner* — Gene Auduong

(57) ABSTRACT

In one embodiment, a voltage discharge (VD) system has a slow VD subsystem that provides two concurrent discharge current paths to at least begin to discharge both positive and negative voltages: a first path from the positive-voltage node to ground and a second path from the positive-voltage node to the negative-voltage node. In addition to this relatively slow VD subsystem, the VD system can also have a conventional fast VD subsystem that is turned on after the slow VD subsystem has reduced the positive and negative voltages to some degree (e.g., half of each charge removed). Such a VD system can eliminate dangerous overshoot conditions, even when control-signal skew is present.

18 Claims, 9 Drawing Sheets

100

200

VOLTAGE DISCHARGE CIRCUIT HAVING DIVIDED DISCHARGE CURRENT

TECHNICAL FIELD

The present invention relates to electronics, and, more specifically but not exclusively, to voltage discharge circuits for discharging high voltages used to erase non-volatile memory devices.

BACKGROUND

This section introduces aspects that may help facilitate a better understanding of the invention. Accordingly, the statements of this section are to be read in this light and are not to be understood as admissions about what is prior art or what is not prior art.

Integrated circuits (ICs) containing non-volatile memory typically employ high voltages to force charge into and out of floating-gate memory storage elements. To produce sufficient electric field across the floating gates without exceeding the breakdown limits of the technology, device terminals may be charged to opposite polarities with respect to the substrate, often by high-impedance charge pumps. Flash memory technology uses this technique when erasing the memory array. Large circuit capacitances, including the capacitance that couples arrays of memory gates to their respective source, drain, and well terminals, thereby charge to voltages that can approach the positive and negative breakdown limits of the IC technology.

Removing charge stored on high-voltage nodes after erasing is conventionally done by connecting all array terminals to ground through discharge transistors. But this can cause terminals to overshoot above safe operating limits. The overshoot problem arises because only part of the charge stored on high-voltage nodes is on capacitance that is coupled to the IC's substrate. A significant portion of the charge is stored on capacitance coupled between the gates and bodies of the memory cells, which were charged to opposite high-voltage polarities with respect to substrate during the prior erase.

The overshoot problem cannot be solved simply by attempting to discharge one terminal at a time toward the substrate voltage, as this causes the other end of each coupled capacitance to move in the same direction. Discharging the array well terminal that was charged to positive polarity pulls the gate, which was charged to negative polarity, still more negative. Discharging the negative gate terminal toward ground pulls the well terminal more positive. The overshoots that result from this coupling can cause the switching transistors to over-stress or snap back, potentially causing catastrophic damage to the switching transistors.

The conventional way to discharge capacitances has been to simultaneously turn on transistors that connect each circuit node to the common ground. An attempt is made to provide substantially equal impedance paths to ground from all high-voltage nodes. The timing skew between activation of the various discharge transistors must be carefully controlled to minimize overshoot. Also, the relative strengths of the discharging transistor channels must be carefully adjusted to carry the sum of displacement currents from all capacitance branches attached to each node. This balance of discharge-path sizing and precise timing control is critical to reduce overshoot to acceptable levels, yet is increasingly difficult to achieve with sufficient accuracy in ever-larger memory arrays having a variable number of storage elements with lower over-voltage tolerances, as in newer generations of flash memories on integrated devices such as field-programmable gate arrays (FPGAs).

FIG. 1 is a schematic block diagram representing a voltage discharge (VD) system 100 according to the prior art. VD system 100 has two voltage discharge subsystems: a slow VD subsystem 110 and a fast VD subsystem 120. VD system 100, which is part of a larger integrated circuit, such as an FPGA, is used to discharge high voltages that are generated, e.g., to erase non-volatile memory that is also part of the IC. Before discussing the discharge operations of VD system 100, the IC's charging operations will first be discussed.

In FIG. 1, the nodes positive_pump and negative_pump represent the positive and negative output terminals, respectively, of a high-impedance positive and negative charge pump (not shown) implemented in the IC. In addition, device i26 represents an entire memory array containing (in this particular case) 488,320 non-volatile (e.g., flash) memory cells, where the node N1T collectively represents the (possibly) common-voltage word lines connected to the gates of the cells in that memory array, and the node array_well collectively represents the (possibly) common-voltage wells (e.g., both the P-well body and the N-well (isolation island) typically connected beneath each cell) in that memory array. In this exemplary array, each cell resides in a double-well structure consisting of a P-well inside an N-well, where both wells are tied together, inside a P-substrate.

Capacitor neg_filter models a decoupling capacitor placed between the node negative_pump and ground (Vss), which capacitor may be used to reduce noise and ripple components on the negative supply.

In order to erase the memory array, with the node N1T connected to the charge pump's negative terminal negative_pump (via the word lines and via switches not shown in FIG. 1), erase control signal erase_n is driven low (e.g., to Vss), which turns on the device "precharger", thereby connecting the charge pump's positive terminal positive_pump to the node array_well. In one implementation, for erasure, the charge pump applies a positive voltage (Vpp) of about +8.5v to drive the flash cells' P-well and N-well terminals above the substrate potential Vss, where the positive logic supply voltage level Vcc is about 1.2v, and the charge pump applies a negative voltage (Vneg) of about −8.5v to the flash cells' gate terminals below the substrate potential. The high-voltage differential (about 17v) between the positive node array_well and the negative node N1T erases the memory cells in the array.

After the memory has been erased, erase control signal erase_n is driven high (e.g., Vpp) to turn off the precharger device, thereby disconnecting the node array_well from the terminal positive_pump. At this point, however, the capacitances on node array_well retain their charged state, which maintains array_well at a high positive potential with respect to ground, and the capacitances on node negative_pump retain their charged state, which maintains negative_pump at a high negative potential.

In order to discharge those high positive and negative charges, VD system 100 implements a two-stage discharge sequence. During the first stage, slow VD subsystem 110 is turned on to slowly discharge the node negative_pump towards ground (Vss). During the second stage, with slow VD subsystem 110 either turned off or left on, fast VD subsystem 120 is turned on to quickly discharge the node array_well toward ground, while accelerating the discharge of the node negative_pump towards ground. Performing the first stage prior to the second stage reduces the displacement current through gate-coupling capacitance that could otherwise produce undesirable levels of overshoot at the node array_well.

In particular, prior to initiation of the first stage, the slow discharge control signal slow_discharge is low, which results in device i38 of slow VD subsystem 110 being off, thereby disconnecting that path from the node negative_pump to ground. To initiate the first stage, slow discharge control signal slow_discharge is driven high (Vcc), which turns on device i38. This pulls node "sdis" to Vcc, which causes source-follower device i37 to begin pulling node negative_pump upward (less negative) at a rate determined by the capacitances on negative_pump and the channel impedances of i37, i38, and i58. PMOS device i38 prevents node sdis from pulling below ground, to prevent forward-biasing the NMOS drain to P-substrate junctions in inverter i58; its channel impedance is made relatively large to maintain a slow pullup rate on negative_pump. Triple-well NMOS device i37 prevents negative_pump from pulling above ground by cutting off as negative_pump approaches its grounded gate voltage.

During the first stage of discharge operations, the voltage at the node negative_pump is monitored by control circuitry (not shown in FIG. 1). When that control circuitry determines that the voltage at the node negative_pump has discharged beyond a set detection level, then the second stage of discharge operations is initiated.

In particular, prior to initiation of the second stage, the fast discharge control signals clamp_pos and clamp_neg are set low (e.g., Vss) and high (e.g., Vcc), respectively. With control signal clamp_pos low, devices i60, i50, and i51 are all off, thereby disconnecting that path from the node array_well to ground. Similarly, with control signal clamp_neg high, devices i30 and i142 are both off, thereby disconnecting that path from the node negative_pump to ground.

To initiate the second stage, control signals clamp_pos and clamp_neg are driven high (e.g., Vpp) and low (e.g., Vss), respectively. Driving control signal clamp_pos high turns on devices i60, i50, and i51, thereby connecting the node array_well to ground. Driving control signal clamp_neg low turns on device i30, which drives the node neg_gate high, which, in turn, turns on device i142, thereby connecting the node negative_pump to ground. Transistors i30 and i142 and resistor i32 form a circuit that clamps a negative potential at node negative_pump to ground (Vss) under control of the positive-logic level control signal clamp_neg.

Although the reverse displacement current from the positive discharge path (i.e., from array_well to ground via devices i60, i50, and i51) causes negative overshoot of the node negative_pump, the reduced voltage on the node negative_pump provides enough headroom to avoid over-stress there. However, this approach slows but does not completely eliminate the positive overshoot problem. As such, the transistors used to discharge the node array_well must be built to withstand particularly high voltages, usually by stacking multiple devices in series (cascode arrangement). This method also adds complexity by requiring a discharge-level sensor, and the slow-discharge rate must be carefully adjusted for each load situation to obtain an acceptable trade-off between positive and negative overshoots and the added discharge time.

SUMMARY

In one embodiment, the present invention is, in an integrated circuit having a reference-voltage ground, a method for discharging a positive node having a positive voltage relative to ground and a negative node having a negative voltage relative to ground. Concurrent first and second discharge paths are established, wherein (i) the first discharge path is between ground and a first node of the negative and positive nodes and (ii) the second discharge path is between the negative and positive nodes. Discharge current from the first node is divided between the first discharge path and the second discharge path.

In another embodiment, the present invention is, an integrated circuit having a reference-voltage ground and comprising a voltage discharge (VD) system for discharging a positive node having a positive voltage relative to ground and a negative node having a negative voltage relative to ground. The VD system comprises first and second discharge paths. The first discharge path is between ground and a first node of the negative and positive nodes. The second discharge path is between the negative and positive nodes, such that the first and second discharge paths concurrently divide discharge current from the first node between the first discharge path and the second discharge path.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

FIGS. 3-6 illustrate voltage discharge using the VD system of FIG. 1, while

DETAILED DESCRIPTION

Figure 1:
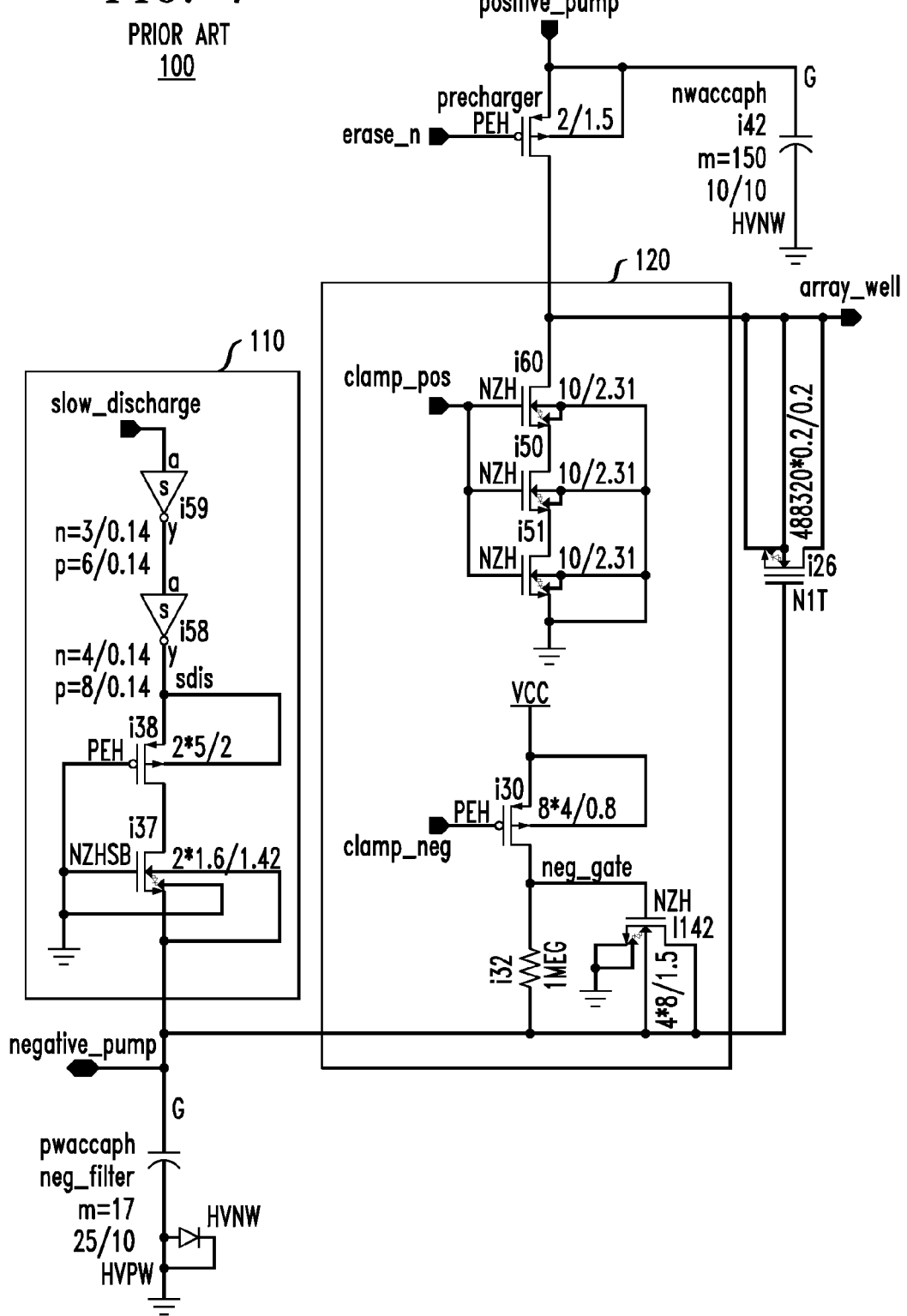
FIG. 1 is a schematic block diagram representing a voltage discharge (VD) system according to the prior art.
Figure 2:
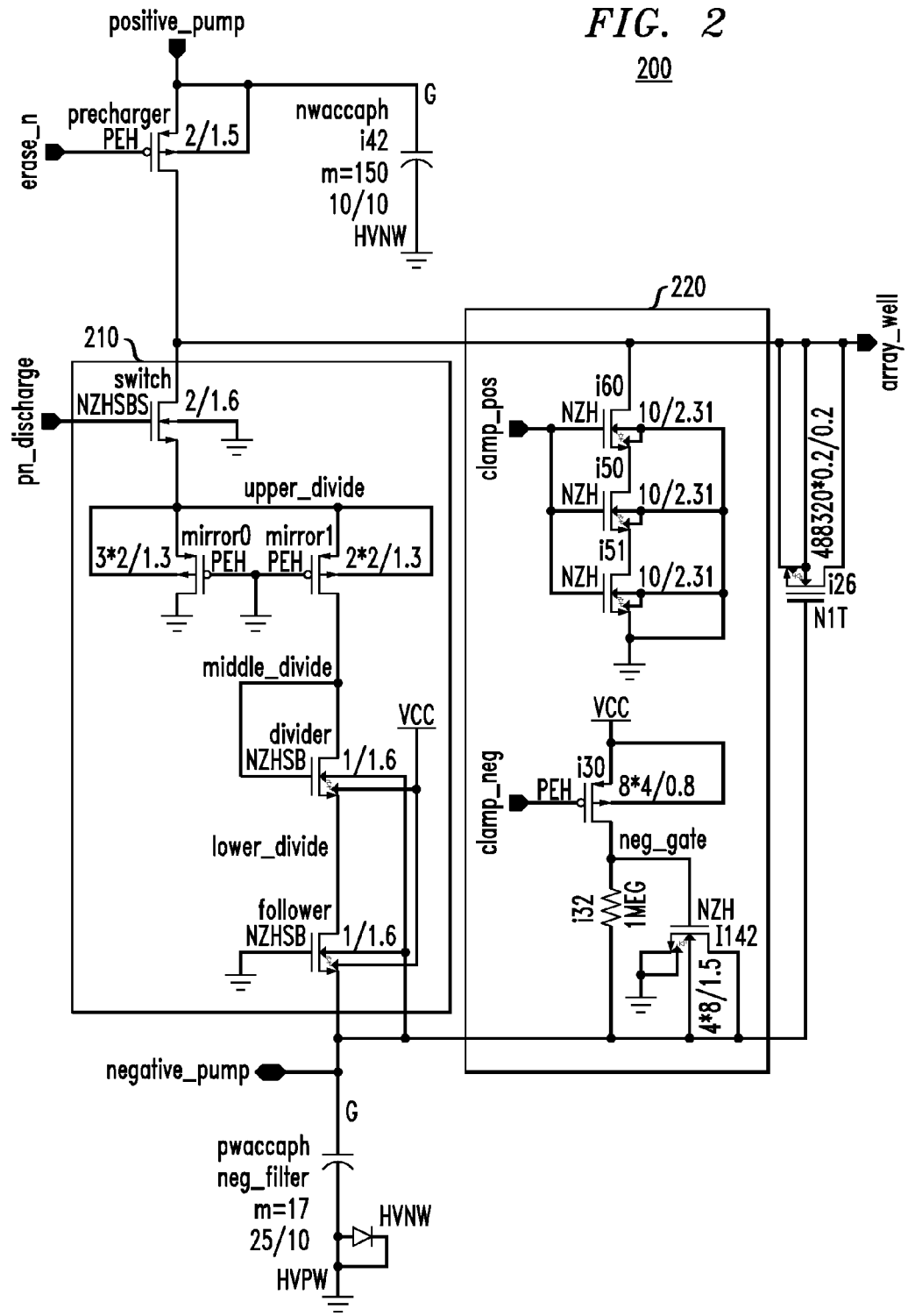
FIG. 2 is a schematic block diagram representing a VD system according to one embodiment of the present invention.

FIG. 2 is a schematic block diagram representing a voltage discharge (VD) system 200 according to one embodiment of the present invention. Like VD system 100 of FIG. 1, VD system 200 has two voltage discharge subsystems: a slow VD subsystem 210 and a fast VD subsystem 220. VD system 200, which is part of a larger integrated circuit, such as an FPGA, is used to discharge high voltages that are generated, e.g., to erase non-volatile memory that is also implemented on the IC.

Fast VD subsystem 220 is substantially identical to fast VD subsystem 120 of FIG. 1. Likewise, the high-impedance charge pump (not shown) and memory array of the IC of FIG. 2 are substantially identical to the high-impedance charge pump (also not shown) and memory array of the IC of FIG. 1. As such, the nodes array_well and negative_pump of FIG. 2 get charged to high positive and negative voltages, respectively, during memory erase operations in a substantially identical manner as that described earlier for FIG. 1.

Furthermore, analogous to that described earlier for FIG. 1, VD system 200 is operated in a two-stage discharge sequence, in which slow VD subsystem 210 is turned on for the first stage and then fast VD subsystem 220 is turned on for the second stage (whether or not slow VD subsystem 210 is turned off or left on).

In particular, prior to initiation of the first stage, slow-discharge control signal pn_discharge is driven to Vss, which results in the device "switch" being off, thereby disconnecting the node array_well from the rest of slow VD subsystem 210 (e.g., during the erase operation when the precharger device is on). To initiate the first stage, control signal pn_discharge is driven substantially more positive than the sum of the thresholds of devices "switch" and "mirror0", which turns on the "switch" device, causing the voltage on the node upper_divide to rise, thereby turning on devices mirror0 and mirror1. Turning on mirror 1 causes the voltage on the node middle_divide to rise, thereby turning on the device "divider", which in turn causes the voltage on the node lower_divide to rise, thereby turning on the device "follower".

With the mirror0 on, discharge current flows from the node array_well through the mirror0 to ground. At the same time, with devices mirror1, divider, and follower on, discharge current also flows from the node array_well through those three devices to the node negative_pump.

PMOS transistors mirror0 and mirror1 form a current mirror, due to their identical gate, source, and body connections. Both devices operate in saturation since both drains satisfy the saturation condition |Vdrain|>|Vgate−Vt|, where Vt is the device threshold voltage. Therefore, their channel currents are maintained at the constant ratio of (W/L of mirror0) to (W/L of mirror1), where W and L are the device width and length, respectively. This ratio of transistor sizes is preferably set in the range from about 1:1 to about 2:1, where the ratio 1.5:1 is illustrated in FIG. 2. That mirror ratio is roughly half the ratio of (i) the junction capacitance between the node array_well and the substrate to (ii) the gate capacitance between the nodes array_well and negative_pump.

Thus, the minor discharges approximately 60% of the node array_well's discharge current to ground Vss and approximately 40% of the node array_well's discharge current toward the node negative_pump, producing substantially equal discharge rates of the array capacitances. The device mirror0 provides a current path to Vss (substrate) that discharges the displacement current from the capacitance coupling of the node array_well to Vss. This capacitance comes mostly from the array's N-well junction. The device mirror 1 provides a current path, proportional to that of mirror0, which discharges the displacement current from the capacitance coupling of the node array_well to the node negative_pump. This capacitance comes mostly from the array's gate-to-P-well (gate oxide) capacitance.

NMOS transistor "divider" establishes a voltage division between the nodes upper_divide and lower_divide that reduces the voltage stress across the transistors "mirror1" and "follower". NMOS transistor "follower" is a weak source-follower whose grounded gate prevents the node negative_pump from being pulled above Vss-Vt by the charge (at Vpp potential) coming from the node array_well. That prevents any possibility of forward biasing NMOS junctions connected to negative_pump, such as the P-well to N-well junction of i142.

Figure 3A:
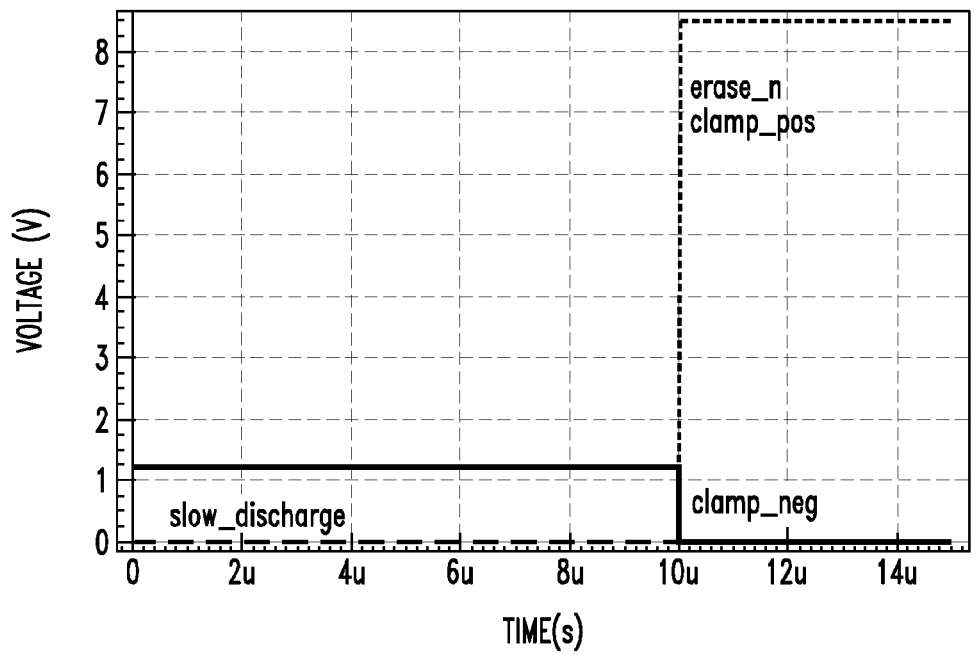
Figure 3B:
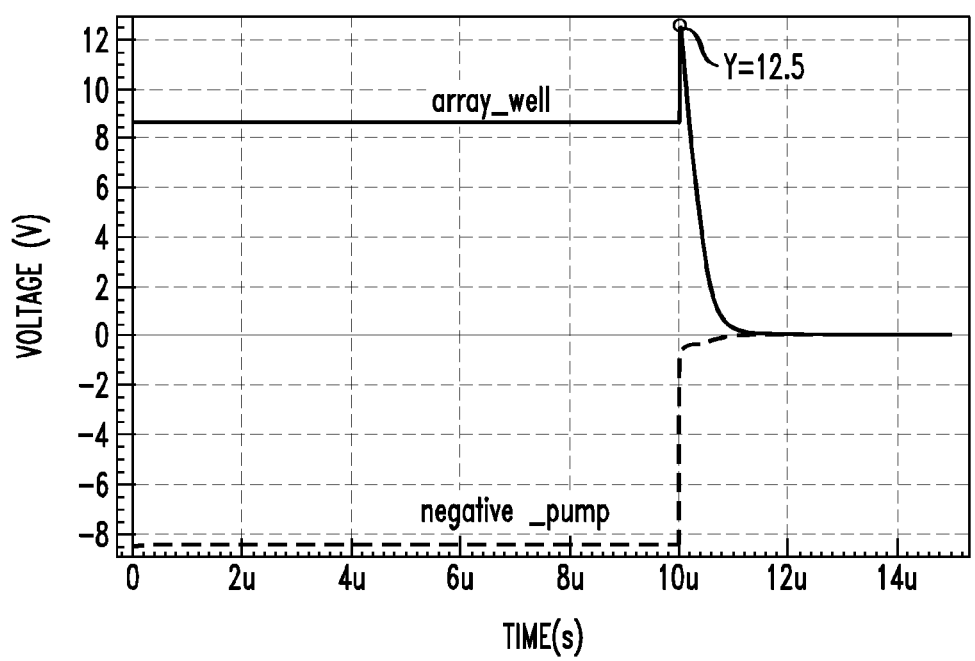
Figure 4A:
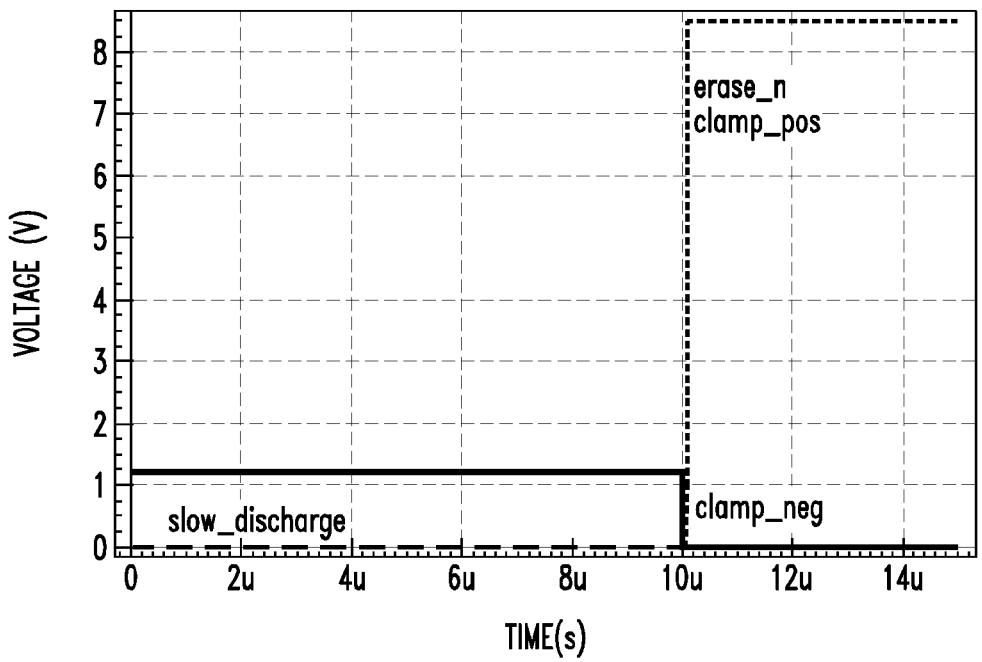
Figure 4B:
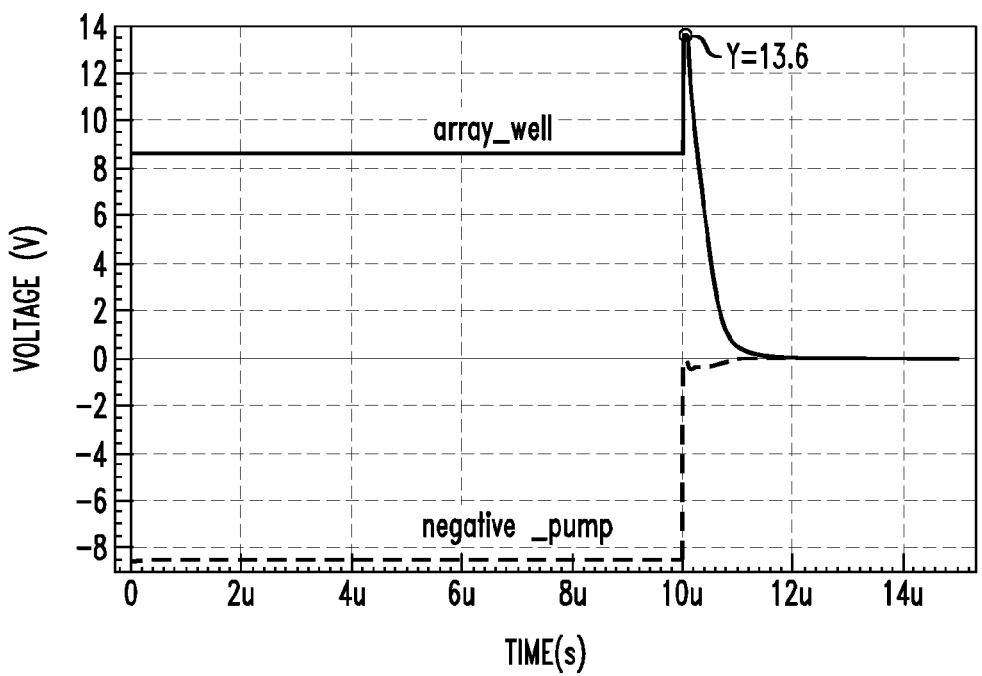
Figure 5A:
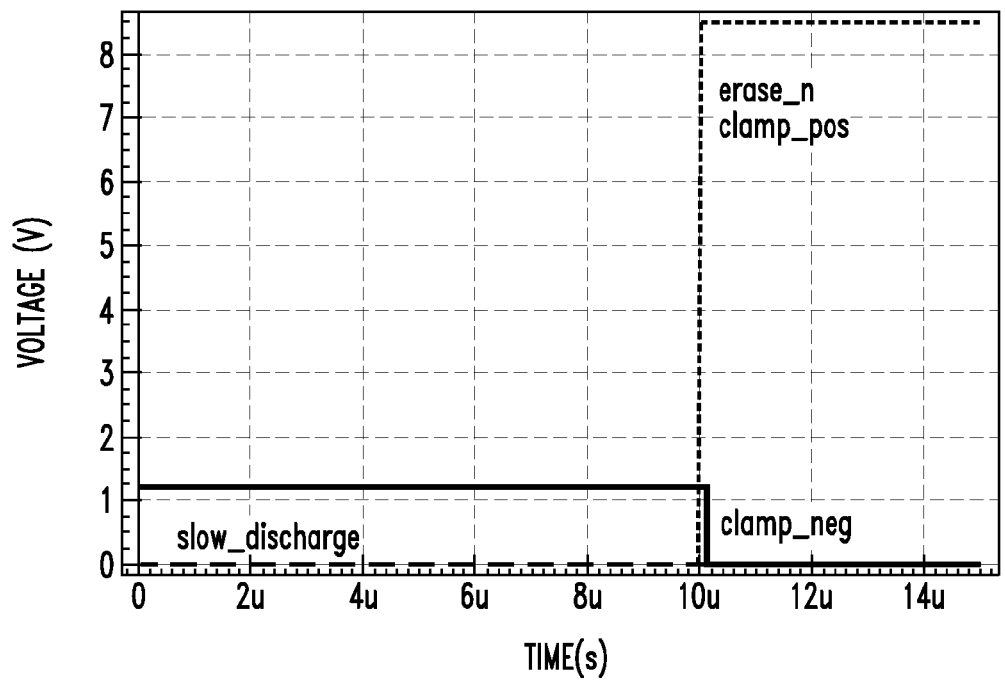
Figure 5B:
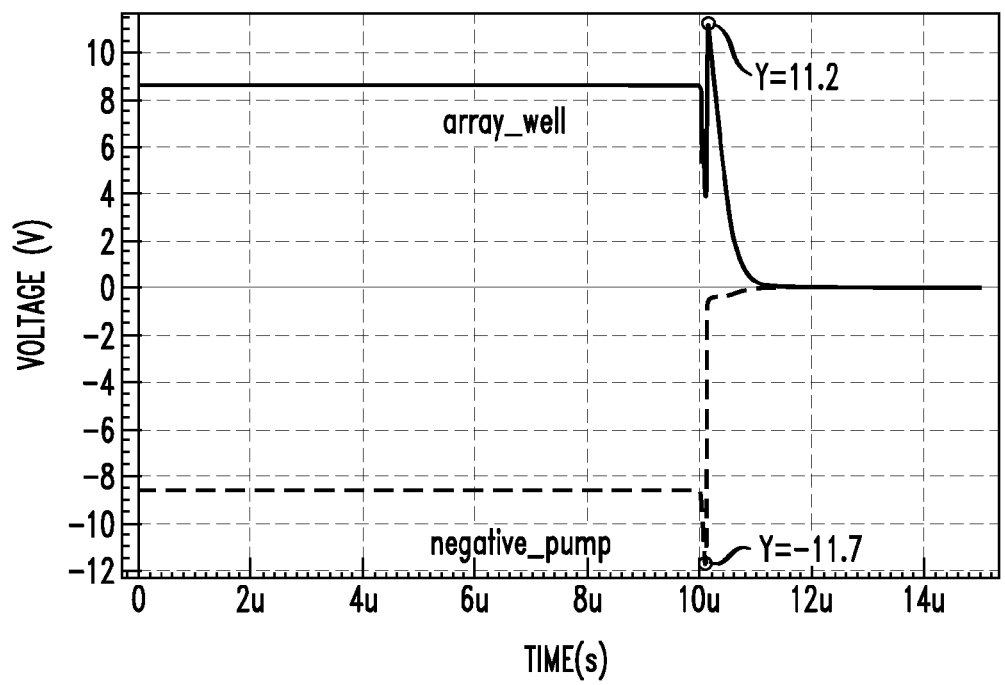
Figure 6A:
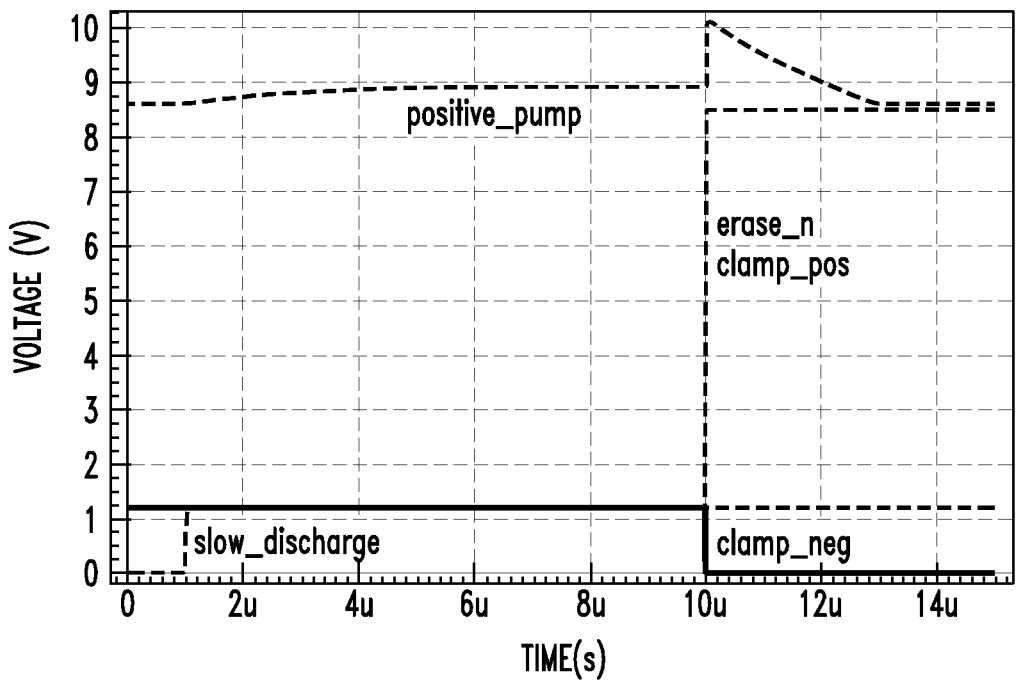
Figure 6B:
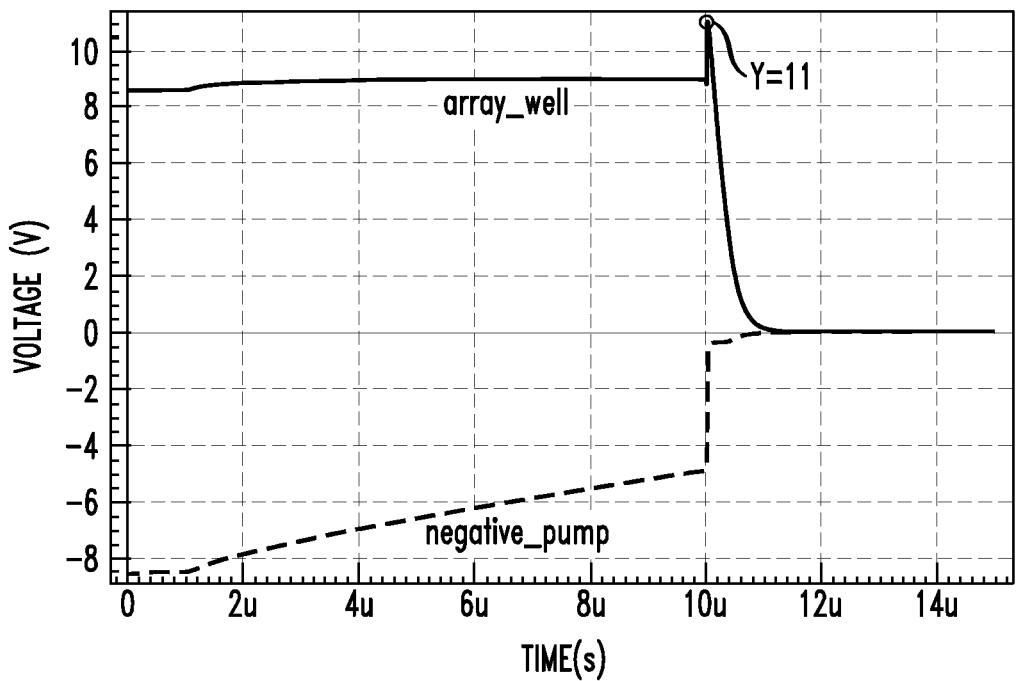
Figure 7A:
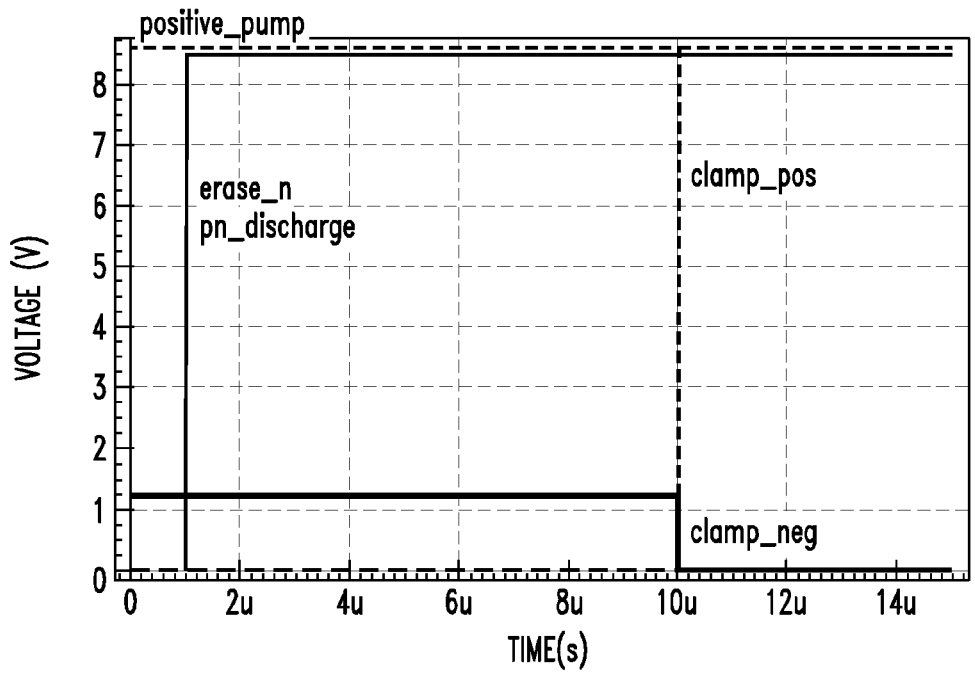
FIGS. 7-9 illustrate voltage discharge using the VD system of FIG. 2.
Figure 7B:
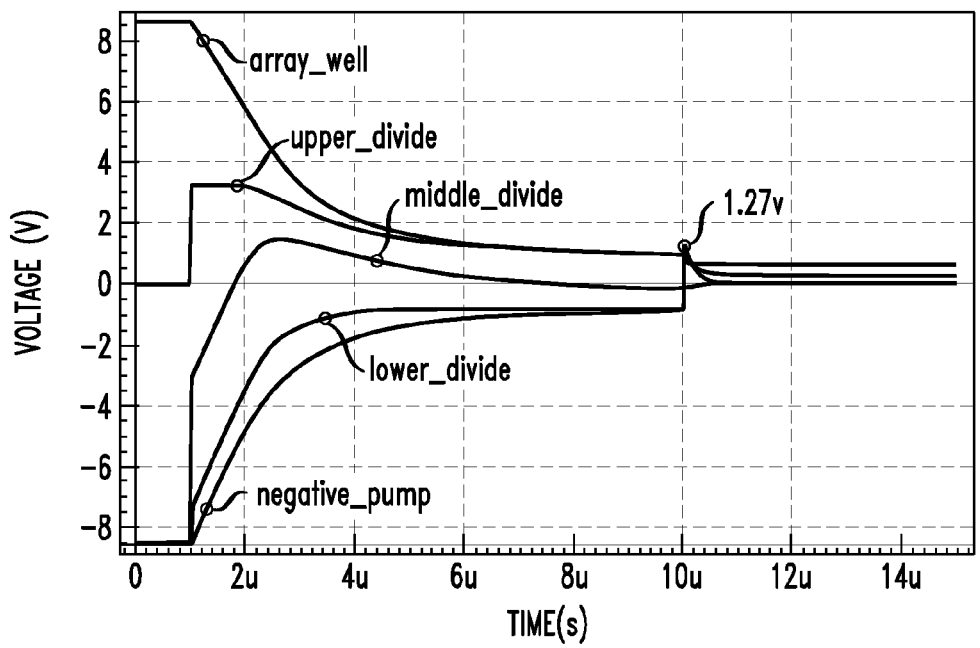
Figure 8A:
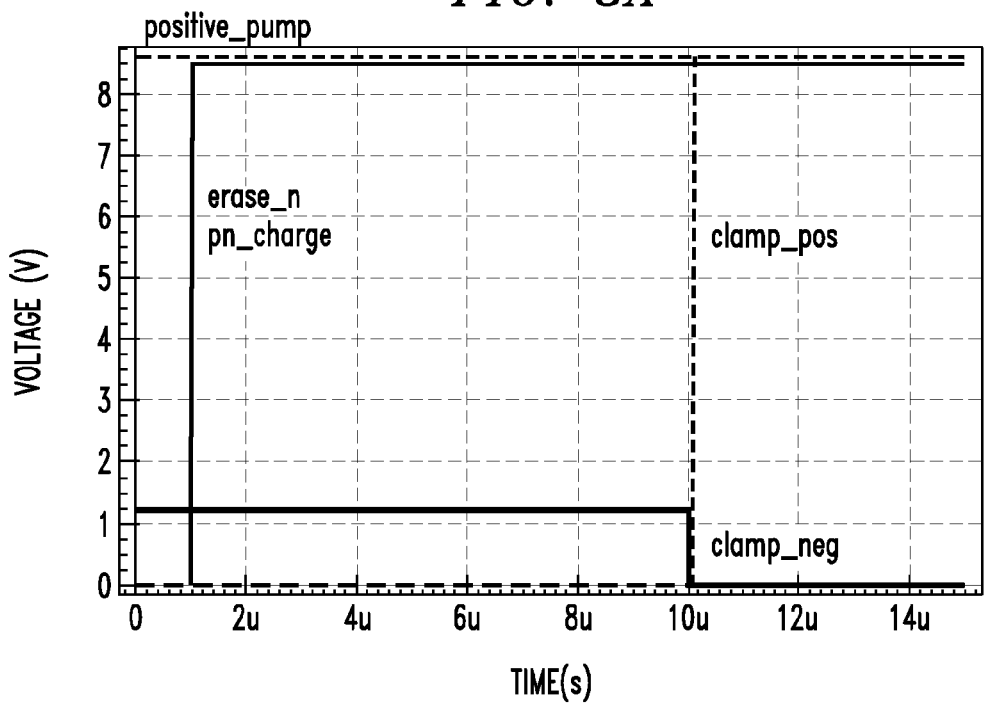
Figure 8B:
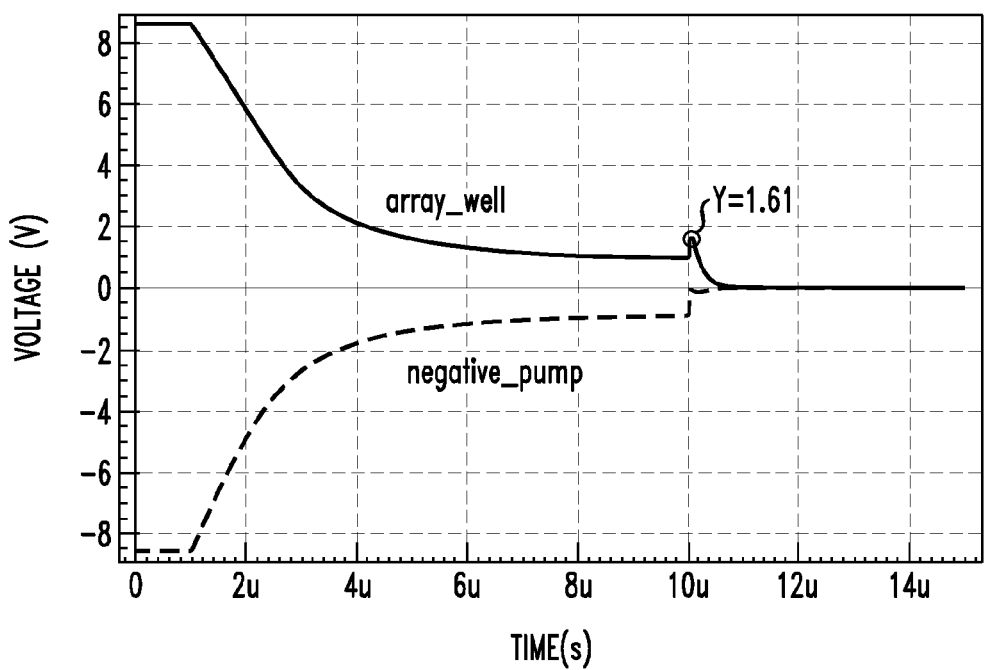
Figure 9A:
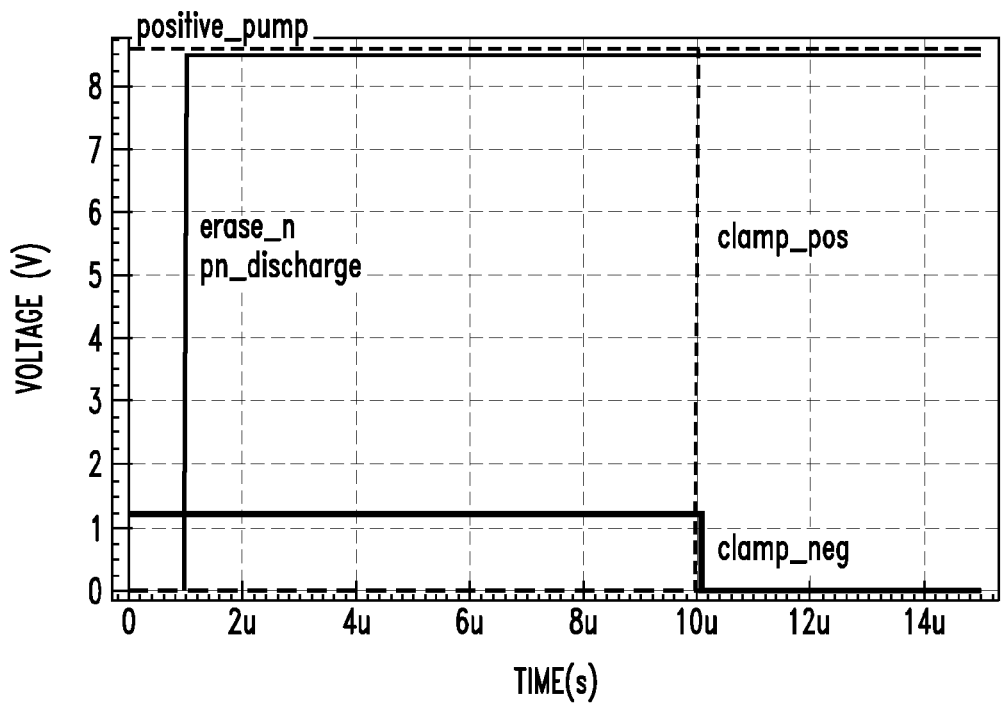
Figure 9B:
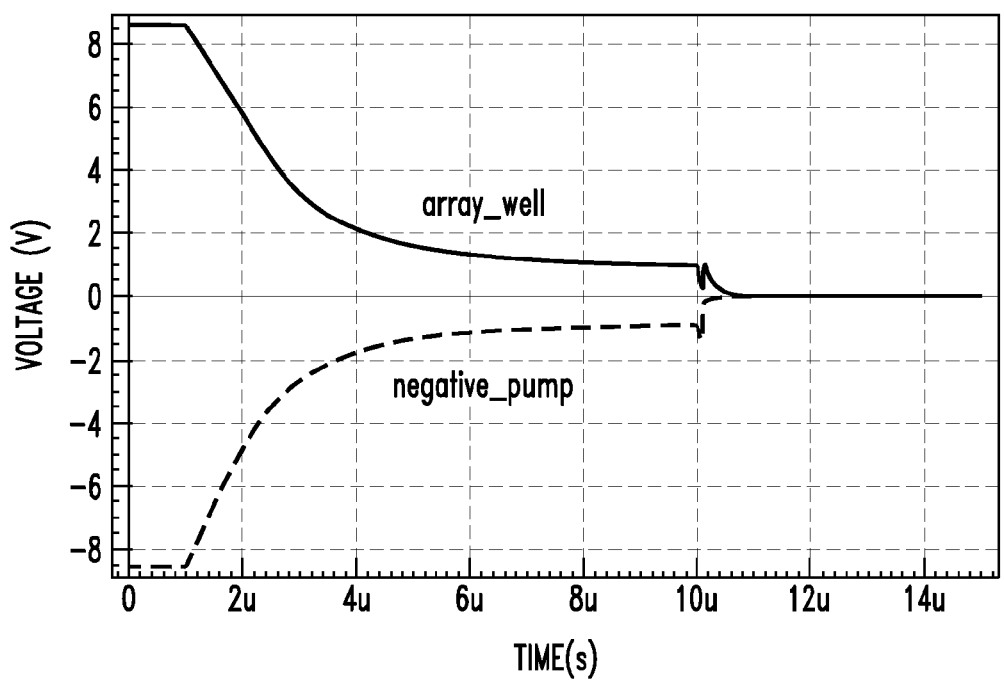

FIGS. 3-6 illustrate voltage discharge using VD system 100 of FIG. 1, while FIGS. 7-9 illustrate voltage discharge using VD system 200 of FIG. 2. In particular:

FIG. 3(A) shows the voltage levels of control signals erase_n, slow_discharge, clamp_pos, and clamp_neg, and FIG. 3(B) shows the voltage levels of nodes array_well and negative_pump for a scenario in which only fast VD subsystem 120 of VD system 100 is used to discharge array_well and negative_pump, and there is no skew between clamp_pos and clamp_neg;

FIG. 4(A) shows the voltage levels of control signals erase_n, slow_discharge, clamp_pos, and clamp_neg, and FIG. 4(B) shows the voltage levels of nodes array_well and negative_pump for a scenario in which only fast VD subsystem 120 of VD system 100 is used to discharge array_well and negative_pump, and there is a +100 ns skew between clamp_pos and clamp_neg (i.e., where clamp_pos lags clamp_neg by 100 ns);

FIG. 5(A) shows the voltage levels of control signals erase_n, slow_discharge, clamp_pos, and clamp_neg, and FIG. 5(B) shows the voltage levels of nodes array_well and negative_pump for a scenario in which only fast VD subsystem 120 of VD system 100 is used to discharge array_well and negative_pump, and there is a −100 ns skew between clamp_pos and clamp_neg (i.e., where clamp_pos leads clamp_neg by 100 ns);

FIG. 6(A) shows the voltage levels of control signals erase_n, slow_discharge, clamp_pos, and clamp_neg, and FIG. 6(B) shows the voltage levels of nodes array_well and negative_pump for a scenario in which first slow VD subsystem 110 and then fast VD subsystem 120 of VD system 100 are used to discharge array_well and negative_pump, and there is no skew between clamp_pos and clamp_neg;

FIG. 7(A) shows the voltage levels of control signals erase_n, pn_discharge, clamp_pos, and clamp_neg, and FIG. 7(B) shows the voltage levels of nodes array_well, upper_divide, middle_divide, lower_divide, and negative_pump for a scenario in which first slow VD subsystem 210 and then fast VD subsystem 220 of VD system 200 are used to discharge array_well and negative_pump, and there is no skew between clamp_pos and clamp_neg;

FIG. 8(A) shows the voltage levels of control signals erase_n, pn_discharge, clamp_pos, and clamp_neg, and FIG. 8(B) shows the voltage levels of nodes array_well, upper_divide, middle_divide, lower_divide, and negative_pump for a scenario in which first slow VD subsystem 210 and then fast VD subsystem 220 of VD system 200 are used to discharge array_well and negative_pump, and there is a +100 ns skew between clamp_pos and clamp_neg; and FIG. 9(A) shows the voltage levels of control signals erase_n, pn_discharge, clamp_pos, and clamp_neg, and FIG. 9(B) shows the voltage levels of nodes array_well, upper_divide, middle_divide, lower_divide, and negative_pump for a scenario in which first slow VD subsystem 210 and then fast VD subsystem 220 of VD system 200 are used to discharge array_well and negative_pump, and there is a −100 ns skew between clamp_pos and clamp_neg.

Each discharge scenario begins at the end of a conventional erase operation. At that time (t=0 usec), the control signals erase_n and clamp_pos are at Vss (i.e., 0v in FIGS. 3-9), and the control signal clamp_neg is at Vcc (i.e., 1.2v in FIGS. 3-9). As such, the precharger device is on to connect the terminal positive_pump to the node array_well, and the fast VD subsystem (i.e., 120 in FIGS. 3-6 and 220 in FIGS. 7-9) is off. In addition, at time (t=0 usec), in FIGS. 3-6, the control signal slow_discharge is at Vss and, in FIGS. 7-9, the control signal pn_discharge is at Vss, such that the slow VD subsystem (i.e., 110 in FIGS. 3-6 and 210 in FIGS. 7-9) is off. During the conventional erase operation, the common P-well and N-well junctions in the flash array are charged to high positive voltages, as reflected in FIGS. 3-9 by the node array_well being at +8.5v (Vpp) at time (t=0 usec). In addition, the flash cells' gates are charged to high negative voltages, as reflected in FIGS. 3-9 by the node negative_pump being at −8.5v at time (t=0 usec).

In the discharge scenarios of FIGS. 3-5, at or near (when skew is present) time (t=10 usec), the control signals erase_n and clamp_pos are driven to Vpp, while the control signal clamp_neg is driven to Vss, thereby turning off the precharger device, floating the node array_well, and turning on fast VD subsystem 120. Note that, in conventional operations, the control signal erase_n would be driven to Vpp to float the node array_well before turning on fast VD subsystem 120.

In the discharge scenario of FIG. 6, at time (t=1 usec), the control signal slow_discharge is driven to Vcc, thereby turning on slow VD subsystem 110. As in the scenarios of FIGS. 3-5, at time (t=10 usec), the control signals erase_n and clamp_pos are driven to Vpp, while the control signal clamp_neg is driven to Vss, thereby turning off the precharger device, floating the node array_well, and turning on fast VD subsystem 120.

In the discharge scenarios of FIGS. 7-9, at time (t=1 usec), the control signals erase_n and pn_discharge are driven to Vpp, thereby turning off the precharger device, floating the node array_well, and turning on slow VD subsystem 110. At or near time (t=10 usec), the control signal clamp_pos is driven to Vpp, while the control signal clamp_neg is driven to Vss, thereby turning on fast VD subsystem 120.

As shown in FIG. 3, using only fast VD subsystem 120 of FIG. 1 results in an overshoot condition in which the voltage at the node array_well reaches as high as 12.5v, thereby exceeding the drain breakdown voltage of approximately +/−9v and risking damage to the flash memory. As shown in FIGS. 4 and 5, the existence of skew between the control signals clamp_pos and clamp_neg results in either an even larger overshoot condition at the node array_well (13.6v in FIG. 4) or a negative overshoot condition at the node negative_pump (−11.7v in FIG. 5). Larger magnitude skew values would typically result in even greater magnitude overshoot conditions.

As shown in FIG. 6, turning on slow VD subsystem 110 before turning on fast VD subsystem 120 reduces the overshoot condition at the node array_well (11v instead of 12.5v), but the overshoot still exceeds the drain junction breakdown voltage of about 9v.

As shown in FIG. 7, for the analogous scenario of turning on the slow VD subsystem 9 usec prior to turning on the fast VD subsystem, VD system 200 of FIG. 2 results in an overshoot condition of only about 1.3v at the node array_well. As shown in FIGS. 8 and 9, even when there is skew between the control signals clamp_pos and clamp_neg, the over shoot conditions are still much lower than the 9v drain junction breakdown voltage (i.e., about 1.6v at the node array_well as in FIG. 8 and about −1.5v at the node negative_pump as in FIG. 9).

Turning on slow VD subsystem 210 (i.e., by turning on the device "switch") simultaneously activates two concurrent discharge current paths: (i) one between the node array_well and Vss and (ii) one between the node array_well and the node negative_pump. These two discharge current paths allow the capacitor displacement currents to flow through the array in the precise ratio set by the size ratio between devices mirror0 and mirror 1.

In contrast with the conventional operation of slow VD subsystem 110, the node negative_pump has no direct current path to Vss when only slow VD subsystem 210 is turned on. As a result, there is no source of positive charge from Vss that could couple to the node array_well and pull it above its initial Vpp voltage level. Instead, the single transistor path to Vss through the device mirror0 assures that the node array_well discharges monotonically toward Vss, and that the node negative_pump discharges monotonically toward the node array_well through the device mirror1.

Discharge through devices mirror0 and mirror 1 is continued for sufficient time, e.g., to allow both nodes array_well and negative_pump to lose roughly half of their initial charge. Once enough time has elapsed to allow a substantial portion of the initial charge to be removed, the conventional clamp_pos and clamp_neg control signals are activated to complete the discharge and clamp all nodes to Vss. Note, since half the charge has been removed, the slew rate and sequencing of the final discharge is no longer critical. The elapsed discharge time depends on the array size (load capacitance) but it is not critical, so no precision end-point voltage detection is needed. Timing skew in VD system 200 between the control signals clamp_pos and clamp_neg is not critical.

To summarize, VD system 200 of FIG. 2:
1. Discharges large arrays of capacitively coupled nodes that had been charged to both positive and negative polarities without causing significant overshoot in either direction with respect to the substrate during discharge;
2. Provides self-tracking of discharge branch currents, to maintain safe and effective operation over a wide range of loads;
3. Eliminates critical timing skew requirements, by using a single control input that simultaneously activates both positive and negative discharge paths;
4. Provides distributed voltage drops across the devices comprising the discharge paths so that no device exceeds its safe operating limits;
5. Prevents junction forward-biasing that could otherwise lead to snap-back or latch-up damage.

VD system 200 suppresses overshoot by assuring balanced distribution of capacitive discharge (displacement) currents through all the principle branches of the array's coupled capacitance network.

VD system 200 uniformly dissipates the energy stored in both the ground-referenced capacitance components and the coupled-capacitance components of the memory array, instead of just addressing the ground-coupled capacitance as in the prior art. Current balance is maintained and can be adjusted by current-mirror device size ratios. The recommended circuit implementation includes series transistors in the negative discharge path that prevent junction forward-biasing and over-stress voltages across all active devices in a manner that is very tolerant of device size and load variations.

A conductive discharge circuit between a positive node (Vpp on a flash array well) and a negative node (Vneg on the row lines of that flash array) is activated simultaneously with a discharge path between the positive node and Vss. The discharge paths are precisely controlled by the use of a pair of similarly biased current mirrors, one for each current path, such that a differential discharge between the elevated nodes can be precisely controlled and effectively referenced (clamped) to a global ground node.

Although the present invention has been described in the context of a system for discharging voltages associated with erasing memories, the present invention can also be used in other contexts in which voltages are discharged, such as LCD display drivers.

In the embodiment of FIG. 2, VD system 200 provides two concurrent discharge paths: one from the positive-voltage node (i.e., array_well) to ground and the other from the positive-voltage node to the negative-voltage node (i.e., negative_pump). In an alternative embodiment (e.g., in an IC that uses P-channel memory transistor array), a VD system can be designed to provide a different pair of concurrent discharge paths: one from the negative-voltage node to ground and the other from the negative-voltage node to the positive-voltage node.

Although the present invention has been described in the context of FPGAs, those skilled in the art will understand that the present invention can be implemented in the context of other types of integrated circuit devices, such as, without limitation, application-specific integrated circuits (ASICs), programmable logic devices (PLDs), mask-programmable gate arrays (MPGAs), simple programmable logic devices (SPLDs), and complex programmable logic devices (CPLDs).

The present invention may be implemented as (analog, digital, or a hybrid of both analog and digital) circuit-based processes, including possible implementation as a single integrated circuit (such as an ASIC or an FPGA), a multi-chip module, a single card, or a multi-card circuit pack.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Also, for purposes of this description, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

Signals and corresponding nodes or ports may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "output node" refers generically to either the source or drain of a metal-oxide semiconductor (MOS) transistor device (also referred to as a MOSFET), and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi-polar device when the present invention is implemented using bi-polar transistor technology.

It should be appreciated by those of ordinary skill in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. In an integrated circuit having a reference-voltage ground (e.g., Vss), a method for discharging a positive node (e.g., array_well) having a positive voltage (e.g., Vpp) relative to ground and a negative node (e.g., negative_pump) having a negative voltage (e.g., Vneg) relative to ground, the method comprising:
   (a) establishing concurrent first and second discharge paths, wherein:
      the first discharge path (e.g., mirror0) is between ground and a first node of the negative and positive nodes; and
      the second discharge path (e.g., mirror1, divider, follower) is between the negative and positive nodes; and
   (b) dividing discharge current from the first node between the first discharge path and the second discharge path.

2. The invention of claim 1, wherein step (a) comprises using a single control signal to simultaneously establish both the first and second discharge paths.

3. The invention of claim 1, wherein the first node is the positive node.

4. The invention of claim 1, wherein:
   the positive node corresponds to a common well of an array (e.g., i26) of memory cells;
   the negative node corresponds to a plurality of word lines (e.g., N1T) of the array; and the positive and negative voltages are applied to erase the memory cells.

5. The invention of claim 1, wherein the method further comprises, after steps (a) and (b):
(c) establishing a third discharge path (e.g., i60, i50, i51) between the positive node and ground; and
(d) establishing a fourth discharge path (e.g., i142, i32) between the negative node and ground, wherein the third and fourth discharge paths are faster than the first and second discharge paths.

6. The invention of claim 1, wherein the discharge current from the first node is divided between the first and second discharge paths using a current mirror comprising:
a first mirror leg (e.g., mirror0) connected between the first node and ground; and
a second mirror leg (e.g., mirror1) connected between the positive node and the negative node.

7. The invention of claim 6, wherein:
the first discharge path comprises the first mirror leg; and
the second discharge path comprises the second mirror leg and one or more transistors (e.g., divider, follower) connected between the second mirror leg and the negative node.

8. The invention of claim 7, wherein the one or more transistors comprise two transistors (e.g., divider, follower) connected in series.

9. The invention of claim 1, wherein:
step (a) comprises using a single control signal to simultaneously establish both the first and second discharge paths;
the first node is the positive node;
the positive node corresponds to a common well of an array (e.g., i26) of memory cells;
the negative node corresponds to a plurality of word lines (e.g., N1T) of the array;
the positive and negative voltages are applied to erase the memory cells;
the method further comprises, after steps (a) and (b):
(c) establishing a third discharge path (e.g., i60, i50, i51) between the positive node and ground; and
(d) establishing a fourth discharge path (e.g., i142, i32) between the negative node and ground, wherein the third and fourth discharge paths are faster than the first and second discharge paths;
the discharge current from the first node is divided between the first and second discharge paths using a current mirror comprising:
a first mirror leg (e.g., mirror0) connected between the first node and ground; and
a second mirror leg (e.g., mirror1) connected between the positive node and the negative node;
the first discharge path comprises the first mirror leg;
the second discharge path comprises the second mirror leg and one or more transistors (e.g., divider, follower) connected between the second mirror leg and the negative node; and
the one or more transistors comprise two transistors (e.g., divider, follower) connected in series.

10. An integrated circuit having a reference-voltage ground (e.g., Vss) and comprising a voltage discharge (VD) system for discharging a positive node (e.g., array_well) having a positive voltage (e.g., Vpp) relative to ground and a negative node (e.g., negative_pump) having a negative voltage (e.g., Vneg) relative to ground, the VD system comprising first and second discharge paths, wherein:
the first discharge path (e.g., mirror0) is between ground and a first node of the negative and positive nodes; and
the second discharge path (e.g., mirror1, divider, follower) is between the negative and positive nodes, such that the first and second discharge paths concurrently divide discharge current from the first node between the first discharge path and the second discharge path.

11. The invention of claim 10, wherein the VD system further comprises a switch (i.e., "switch") that simultaneously establishes both the first and second discharge paths based on a single control signal.

12. The invention of claim 10, wherein the first node is the positive node.

13. The invention of claim 10, wherein:
the integrated circuit further comprises memory having an array (e.g., i26) of memory cells;
the positive node corresponds to a common well of the array;
the negative node corresponds to a plurality of word lines (e.g., N1T) of the array; and
the positive and negative voltages are applied by a charge pump of the integrated circuit to erase the memory cells.

14. The invention of claim 10, wherein the VD system further comprises:
a third discharge path (e.g., i60, i50, i51) between the positive node and ground; and
a fourth discharge path (e.g., i142, i32) between the negative node and ground, wherein the third and fourth discharge paths are faster than the first and second discharge paths.

15. The invention of claim 10, wherein the VD system comprises a current mirror that divides the discharge current from the first node between the first and second discharge paths, wherein the current mirror comprises:
a first mirror leg (e.g., mirror0) connected between the first node and ground; and
a second mirror leg (e.g., mirror1) connected between the positive node and the negative node.

16. The invention of claim 15, wherein:
the first discharge path comprises the first mirror leg; and
the second discharge path comprises the second mirror leg and one or more transistors (e.g., divider, follower) connected between the second mirror leg and the negative node.

17. The invention of claim 16, wherein the one or more transistors comprise two transistors (e.g., divider, follower) connected in series.

18. The invention of claim 17, wherein:
the VD system further comprises a switch (i.e., "switch") that simultaneously establishes both the first and second discharge paths based on a single control signal;
the first node is the positive node;
the integrated circuit further comprises memory having an array (e.g., i26) of memory cells;
the positive node corresponds to a common well of the array;
the negative node corresponds to a plurality of word lines (e.g., N1T) of the array;
the positive and negative voltages are applied by a charge pump of the integrated circuit to erase the memory cells;
the VD system further comprises:
a third discharge path (e.g., i60, i50, i51) between the positive node and ground; and
a fourth discharge path (e.g., i142, i32) between the negative node and ground, wherein the third and fourth discharge paths are faster than the first and second discharge paths.

* * * * *